US005606283A

United States Patent [19]

Allen et al.

[11] Patent Number: 5,606,283

[45] Date of Patent: Feb. 25, 1997

[54] MONOLITHIC MULTI-FUNCTION BALANCED SWITCH AND PHASE SHIFTER

[75] Inventors: Barry R. Allen, Redondo Beach; Dennis C. Lo, Los Angeles; Huei Wang, La Palma; Gee S. Dow, Rancho Palos Verdes, all of Calif.

[73] Assignee: TRW Inc., Redondo Beach, Calif.

[21] Appl. No.: 440,555

[22] Filed: May 12, 1995

[51] Int. Cl.$^{6}$ .............................. H03F 3/68

[52] U.S. Cl. .............. 330/124 R; 330/295; 333/109; 333/156; 333/164

[58] Field of Search .............. 330/124 R, 295, 330/53; 333/109, 156, 164

[56] References Cited

U.S. PATENT DOCUMENTS

| | | | |
|---|---|---|---|
| 3,571,765 | 3/1971 | Friedman | 333/164 |
| 3,931,599 | 1/1976 | Salzberg | 333/164 |
| 4,016,516 | 4/1977 | Sauter et al. | 333/109 X |
| 4,153,886 | 5/1979 | Miedema | 333/156 |
| 4,254,385 | 3/1981 | Childs et al. | 333/164 X |
| 4,352,071 | 9/1982 | Childs et al. . | |
| 4,467,472 | 8/1984 | Wendt . | |
| 4,549,152 | 10/1985 | Kumar . | |
| 4,602,227 | 7/1986 | Clark et al. | 333/109 |
| 4,631,493 | 12/1986 | Vendelin et al. . | |
| 4,723,307 | 2/1988 | Clark et al. | 333/109 X |
| 4,825,177 | 4/1989 | Teague et al. . | |
| 4,939,485 | 7/1990 | Eisenberg . | |
| 4,978,932 | 12/1990 | Gupta et al. . | |
| 5,006,811 | 4/1991 | Kruger . | |
| 5,023,494 | 6/1991 | Tsukii et al. . | |
| 5,027,084 | 6/1991 | Tsukii . | |

(List continued on next page.)

FOREIGN PATENT DOCUMENTS

| | | | |
|---|---|---|---|
| 2251746 | 7/1992 | United Kingdom | 330/295 |

OTHER PUBLICATIONS

Ballantoni, J. V. et al., "A Monolithic High Power Ka Band PIN Switch", IEEE Microwave and Millimeter-Wave Circuits Symposium, pp. 47–50 (1989).

Schindler, Manfred J. et al., "DC–40 GHz and 20–40 GHz MMIC SPDT Switches", IEEE, pp. 1486–1493 (1987).

Lo, D. C. W. et al., "A Novel Monolithic Balanced Switching Low Noise Amplifier", IEEE MTT–S Digest, pp. 1199–1202 (1994).

Neilson, D. et al., "A Broadband Upconverter IC", IEEE MTT–S Digest, pp. 454–458 (1992).

Boire, D. C. et al., "4:1 Bandwidth Digital Five Bit MMIC Phase Shifters", IEEE Microwave and Millimeter-Wave Monolithic Circuits Symposium, pp. 69–73 (1989).

Mazumder, Shamsur R. et al., "A Novel 6 to 8 GHz 180–Degree Bit Phase Shifter Configuration Having Very Small Amplitude and Phase Errors", IEEE MTT–S Digest, pp. 83–86 (1994).

Maas, Steven A., "Balanced and Multiple–Device Circuits", Artech House, pp. 209–221 (1988).

*Primary Examiner*—James B. Mullins
*Attorney, Agent, or Firm*—Michael S. Yatsko

[57] ABSTRACT

A multi-function, balanced phase shifter and switch having a particular application as a balanced switched low-noise amplifier. The switch includes a hybrid input coupler that couples a first input signal at a first input port and a second input signal at a second input port into a first path and a second path of the switch. Each of the first path and the second path include at least one amplifier and a phase shifter. The phase shifters include a hybrid coupler and two switching devices that are simultaneously switched on or off by a single control signal. Output from the two paths are applied to an output hybrid coupler that couples the output from the two paths into first and second output ports of the switch. By controlling the two control signals applied to the phase shifters to selectively switch the switching devices on and off, signals at the input ports can be selectively amplified and switched to the output ports in a balanced, low-noise manner.

20 Claims, 3 Drawing Sheets

U.S. PATENT DOCUMENTS

| | | | |
|---|---|---|---|
| 5,028,880 | 7/1991 | Sakai . | |
| 5,053,719 | 10/1991 | Tsai . | |
| 5,061,911 | 10/1991 | Weidman et al. . | |
| 5,081,706 | 1/1992 | Kim . | |
| 5,086,329 | 2/1992 | Newman . | |
| 5,101,171 | 3/1992 | Redmond . | |
| 5,105,171 | 4/1992 | Wen et al. . | |
| 5,119,050 | 6/1992 | Upshur et al. . | |
| 5,122,690 | 6/1992 | Bianchi . | |
| 5,128,639 | 7/1992 | Ueda et al. | 333/164 |
| 5,146,177 | 9/1992 | Katz et al. | 333/109 X |
| 5,254,492 | 10/1993 | Tsemg et al. . | |
| 5,289,142 | 2/1994 | Upton . | |
| 5,302,958 | 4/1994 | Roberts et al. . | |
| 5,311,156 | 5/1994 | Andoh . | |
| 5,375,257 | 12/1994 | Lampen . | |
| 5,379,007 | 1/1995 | Nakahara | 333/164 X |
| 5,392,009 | 2/1995 | Talwar | 333/109 X |

MONOLITHIC MULTI-FUNCTION BALANCED SWITCH AND PHASE SHIFTER

BACKGROUND OF THE INVENTION

1. Field of the Invention

This invention relates generally to a low-noise, broad band switch and phase shifter and, more particularly, to a monolithic microwave and millimeter wave balanced, low-noise, broad band switch, switch and phase shifter that has particular application as a balanced switching low-noise amplifier.

2. Discussion of the Related Art

High performance, low-noise solid state switches and phase shifters are important control elements for controlling signal flow in high frequency circuit applications. One particular application exists for such a switch and phase shifter in microwave control circuits that are part of a phased-array or focal plane array antenna system. Typical focal plane array or phased-array antenna systems will incorporate a large number of antenna elements that either passively or actively detect radiation from a scene. Each antenna element may include a balanced switching, low-noise amplifier (BSLNA) that is selectively switched on and off to allow RF signals sensed by the particular antenna element to be sent to a detector device, such as a diode, that converts the RF signals to corresponding DC level signals. Currently, such BSLNAs are generally monolithically integrated into monolithic microwave integrated circuits or monolithic millimeter wave integrated circuits (MMICs) along with the antenna array and associated processing circuitry.

Different switching and amplifying elements have been previously used to provide low-noise switching and phase shifting of the type discussed above. Most microwave and millimeter wave switches incorporate PIN diodes or field effect transistors (FETs) in series, shunt, or series-shunt configurations. Although the switches using PIN diodes have demonstrated great performance, they are not monolithically compatible with other FET devices in MMICs. Additionally, PIN diode switches consume more DC power, and require complicated bias circuitry that usually degrades switching speeds. For a discussion of PIN switches in this context, see for example Bellantoni, J. P. et al., "A Monolithic High Power Ka Band PIN Switch," IEEE Microwave and Millimeter-Wave Monolithic Circuit Symposium, May, 1989, pp. 47–53.

On the other hand, FET switches, such as metal semiconductor field effect transistor (MESFET) switches or high electron mobility transistor (HEMT) switches, often show a higher insertion loss than PIN switches. The high insertion loss degrades receiver noise performance and transmitter efficiency especially a high frequency. Further, the parasitic source-drain capacitance of an FET at pinch-off limits the isolation and band width of the FET switches. This adverse parasitic capacitance is further increased with increasing frequency, in particular millimeter wavelength frequencies. For a discussion of FET switches in this context, see for example Schindler, Manfred et al., "DC-40 GHz and 20–40 GHz MMIC SPDT Switches," IEEE Trans. on Microwave Theory and Techniques, Vol. 35, 1987, pp. 1486–1493.

Since phase shifters typically incorporate one or more switches of this type to change the phase difference between input and output signals, the same problems described above also exist for these types of phase shifters.

A need exists for a high performance switch and phase shifter especially suitable for MMIC applications that provides greater device performance than known switch and phase shifters that incorporate PIN diodes or FETs switches in series, shunt, or series-shunt configurations. It is therefore an object of the present invention to provide such a switch and phase shifter.

SUMMARY OF THE INVENTION

In accordance with the teaching of the present invention, various multi-function balanced phase shifter and switches having capabilities for a wide range of integrated circuit applications especially at high frequencies are disclosed. In one embodiment, the phase shifter and switch includes a hybrid input coupler that couples a first input signal at a first input port and a second input signal at a second input port into a first path and a second path. Each of the first path and second path include at least one amplifier and a phase shifter. The phase shifters each includes a hybrid coupler and two switching devices that are simultaneously switched on or off by a single control signal. Outputs from each of the paths are applied to another hybrid coupler that couples the output from the two paths into first and second output ports of the switch. By controlling the two control signals applied to the phase shifters to selectively switch the switching devices on and off, signals at the input ports can be selectively amplified and switched to the output ports in a balanced low-noise manner. In alternate embodiments, impedance matched input and output load resistors are selectively incorporated at the input and output ports.

Additional objects, advantages and features of the present invention will become apparent from the following description and appended claims, taken in conjunction with the accompanying drawings.

DETAILED DESCRIPTION OF THE PREFERRED EMBODIMENTS

The following discussion of the preferred embodiments directed to various multi-function phase shifter and low-noise switches is merely exemplary in nature and is in no way intended to limit the invention or its applications or uses.

Figure 1:
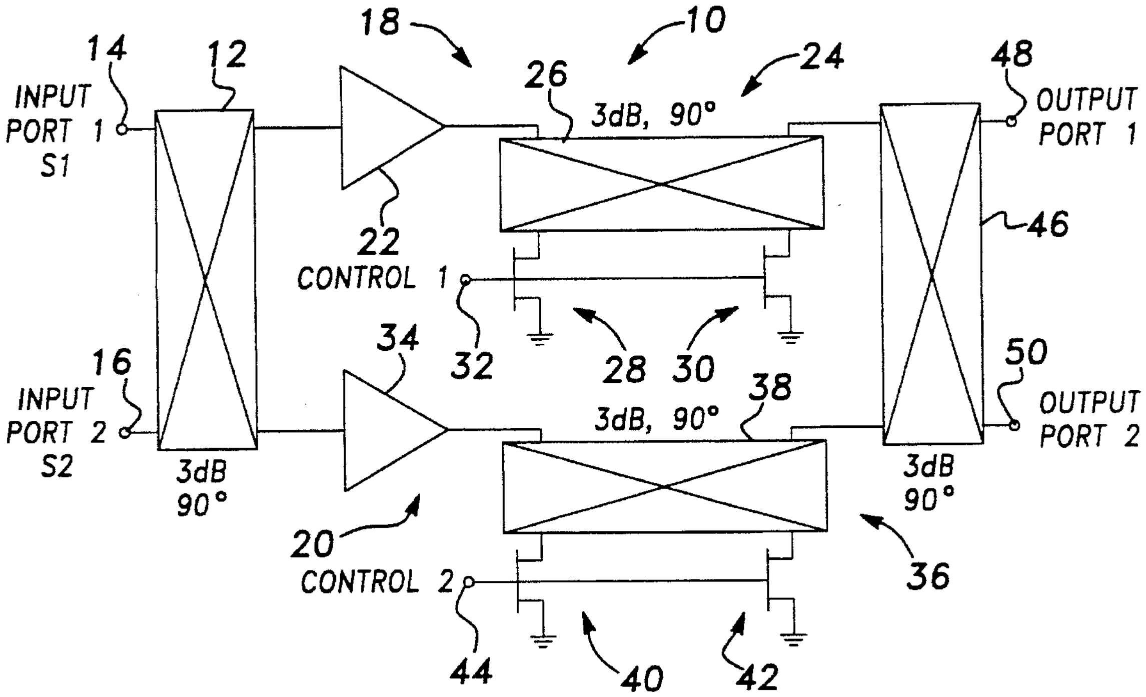
FIG. 1 is a schematic block diagram of a phase shifter and low-noise crossbar switch according to an embodiment of the present invention.

FIG. 1 shows a schematic block diagram of a phase shifter and low-noise switch 10 that acts as a 2×2 crossbar switch, according to one embodiment of the present invention. The switch 10 includes a 3 dB 90° hybrid coupler 12 connected to a first input port 14 (input port 1) and a second input port 16 (input port 2). The coupler 12 can be a Lange coupler or a branch-line coupler, known to those skilled in the art, or any type of hybrid coupler suitable for the purposes described herein. Various types of hybrid couplers of this type can be found in Maas, Steven A., Nonlinear Microwave Circuits, Artech House, 1988, Chapter 5, pp. 209–230. The input ports 14 and 16 can be connected to various types of RF transmission and/or recovery components such as various types of antenna elements (not shown) that may be part of an antenna array. In such a use, the first input port 14 would receive a first RF input signal S1 and the second input port 16 would receive a second RF input signal S2.

The hybrid coupler 12 couples the input signal S1 at the port 14 and the input signal S2 at the port 16 into a first path 18 and a second path 20 of the switch 10. Particularly, the hybrid coupler 12 applies the input signal to the first path 18 at its original phase, and applies the input signal S1 to the second path 20 90° out of phase with the signal applied to the first path 18. Likewise, the hybrid coupler 12 separates the input signal S2 into signals 90° apart in phase and applies one of the signals S2 to the second path 20 at the same phase as the input signal S1 in the second path 20, and applies the other signal S2 to the first path 18 at the same phase as the input signal S1.

The first path 18 includes a low-noise amplifier (LNA) 22 and a 180° reflected phase shifter 24. The phase shifter 24 incorporates a 3 db 90° hybrid coupler 26 that operates in the same manner as the coupler 12 above, and two shunt passive switching devices 28 and 30. The switching devices 28 and 30 can be any suitable integrated circuit microwave or millimeter wave switching device such as an FET switch, an HEMT switch or a PIN diode switch. A first control signal (control 1) from a control device (not shown) is simultaneously applied to the gate terminals of the switching devices 28 and 30 at a gate control port 32 to bias the gate terminals to switch the devices 28 and 30 on and off. Likewise, the second path 20 includes an LNA 34 and a 180° reflected phase shifter 36. The phase shifter 36 includes a 3 db 90° hybrid coupler 38 and switching devices 40 and 42. A second control signal (control 2) from the control device is simultaneously applied to gate terminals of the switching devices 40 and 42 at a gate control port 44 to bias the gate terminals to switch the devices 28 and 30. The operation of the phase shifters 24 and 36 are known in the art as discussed in Neilson, D. et al., "A Broadband Up Converter IC", IEEE MIT-S Digest, September, 1992, pp. 455–458.

Signals from the couplers 26 and 38 are applied to an output 3 db 90° hybrid coupler 46 that couples the amplified input signals S1 and S2 to an output port 48 (output port 1) and an output port 50 (output port 2) in the same manner as the coupler 12 above. Particularly, an output signal from the first path 18 is applied to the output port 48 at one phase and to the output 50 out of phase by 90°. Likewise, an output signal from the second path 20 is applied to the output port 48 in phase with the output signal from the path 18, and to the output port 50 in phase with the output signal from the path 18.

The RF input signals S1 and S2 at the input ports 14 and 16, respectively, are amplified and shifted in phase by the switch 10, and applied at the output ports 48 and 50 to be sent to an appropriate detector circuitry (not shown) depending on the particular application. For the RF input signals S1 and S2 at the input ports 14 and 16, respectively, different bias controls on the gate terminal ports 32 and 44 provide different output signals at the output ports 48 and 50 as shown in a state Table 1 below. Particularly, if the gate terminal ports 32 and 44 are both biased (short), then the output signal at the port 48 will be the gain G of the circuit components of the switch 10, including a combination of the amplifiers 22 and 34, times the input signal S2 at a phase angle θ, and the output signal at the port 50 will be the gain G times the input signal S1 at the phase angle θ. If the gate terminal ports 32 and 44 are unbiased (open), the output signal at the port 48 is the gain G times the input signal S2 at the phase angle θ+180°, and the output signal at the port 50 is the gain G times the input-signal S1 at the phase angle θ+180°. If the gate terminal port 32 is biased and the gate terminal port 44 is unbiased, then the output signal at the output port 48 is the gain G times the input signal S1 at the phase angle ϕ, and the output signal at the output port 50 is the gain G times the input signal S2 at the phase angle ϕ. The phase angle ϕ is equal to the phase angle θ+90°. If the gate terminal port 32 is unbiased and the gate terminal port 44 is biased, then the output signal at the output port 48 is the gain G times the input signal S1 at the phase angle ϕ+180°, and the output signal at the output port 50 is the gain G times the input signal S2 at the phase angle ϕ+180°. As is apparent from this discussion, the switch 10 operates as a 2×2 crossbar switch in that by selectively biasing or unbiasing the ports 32 and 44, a combination of the input signal S1 and S2 can be delivered to either of the output ports 48 and 50.

TABLE 1

| CONTROL | | INPUT | | OUTPUT | |
|---|---|---|---|---|---|
| Control 1 | Control 2 | Port 1 | Port 2 | Port 1 | Port 2 |
| Short | Short | S1 | S2 | G.S2∠θ | G.S1∠θ |
| Open | Open | S1 | S2 | G.S2∠θ + 180° | G.S1∠θ + 180° |
| Short | Open | S1 | S2 | G.S1∠ϕ | G.S2∠ϕ |
| Open | Short | S1 | S2 | G.S1∠ϕ + 180° | G.S2∠ϕ + 180° |

Figure 2:
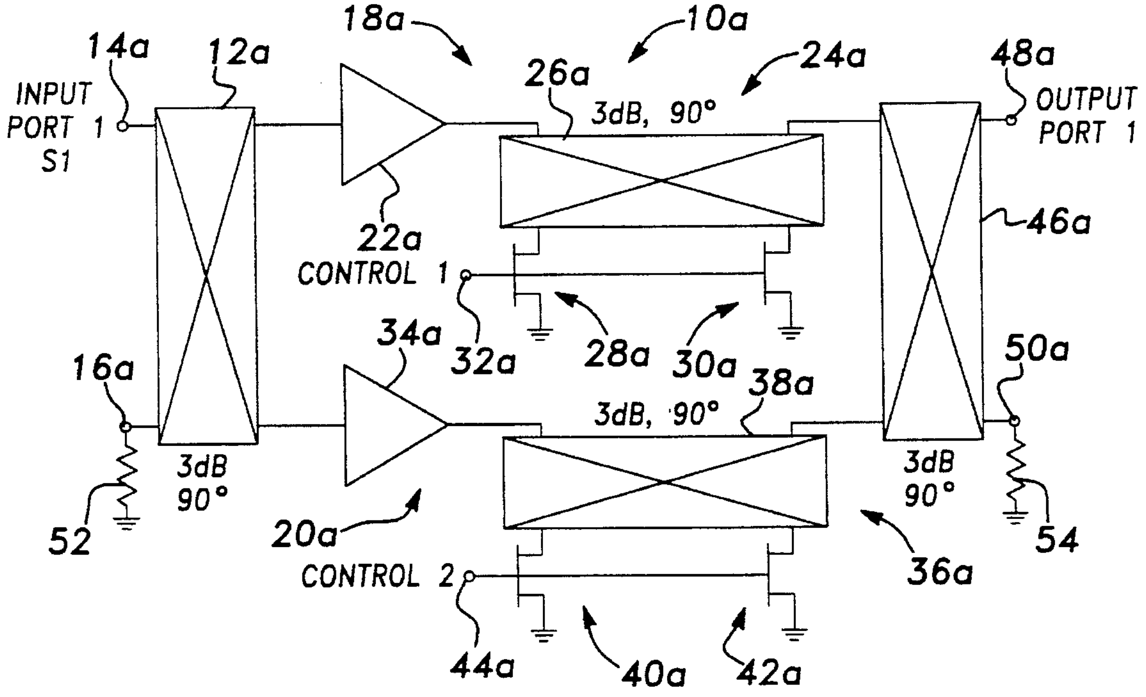
FIG. 2 is a schematic block diagram of a phase shifter and low-noise switch according to another embodiment of the present invention.

FIG. 2 shows a schematic block diagram of a multifunction phase shifter and low-noise switch **10*a* according to another embodiment of the present invention that significantly parallels the structure of the switch 10 above. Like components of the switch 10*a* to that of the switch 10 are labeled the same followed by the reference letter "a". In this embodiment, the input port 16*a* is loaded by an input load represented by a load resistor 52, and thus, no RF input signal is applied to the port 16*a*. Likewise, the output port 50*a* is loaded by an output load represented by a load resistor 54, and thus, no output signal is taken from the port 50*a*. In one embodiment, the load resistors 52 and 54 are 50Ω resistors to provide the impedance matching necessary for most microwave and millimeter integrated circuits. Therefore, the input impedance at the input port 16*a* may be transferred to the output port 48*a* depending on the control signal on the control ports 32*a* and 44*a***.

A state table, Table 2 below, shows the input and output relationship at the ports **14*a* and 48*a*, respectively, when the gate terminal control ports 32*a* and 44*a* are biased and unbiased. Particularly, when both the gate terminal ports 32*a* and 44*a* are simultaneously biased or unbiased, the switch 10*a* acts like a balanced LNA, and the signals from the two paths 18*a* and 20*a* are out of phase and cancelled. Therefore, the switch 10*a* is off at these states. On the other hand, when either of the gate terminal ports 32***a* or 44*a* is biased when the other is unbiased, the signal from the two paths 18*a* and 20*a* are in phase, and the switch 10*a* is on. When the gate terminal port 32*a* is biased and the gate terminal port 44*a* is unbiased, then the output signal at the output port 48*a* is the gain G times the input signal S1 at the phase angle ϕ. If the gate terminal port 32*a* is unbiased and the gate terminal port 44*a* is biased, then the output signal at the output port 48*a* is the gain G times the input signal S1 at the phase angle ϕ+180°. Note that the two on states of the switch 10*a* are 180° out of phase. The switch 10*a* has particular application as a BSLNA to transfer signals to the output port 48*a* during times when the switch 10*a* is on.

TABLE 2

| CONTROL | | INPUT | OUTPUT |
|---|---|---|---|
| Control 1 | Control 2 | Port 1 | Port 1 |
| Short | Short | S1 | 0 |
| Open | Open | S1 | 0 |
| Short | Open | S1 | G.S1∠ϕ |
| Open | Short | S1 | G.S1∠ϕ + 180° |

Figure 3:
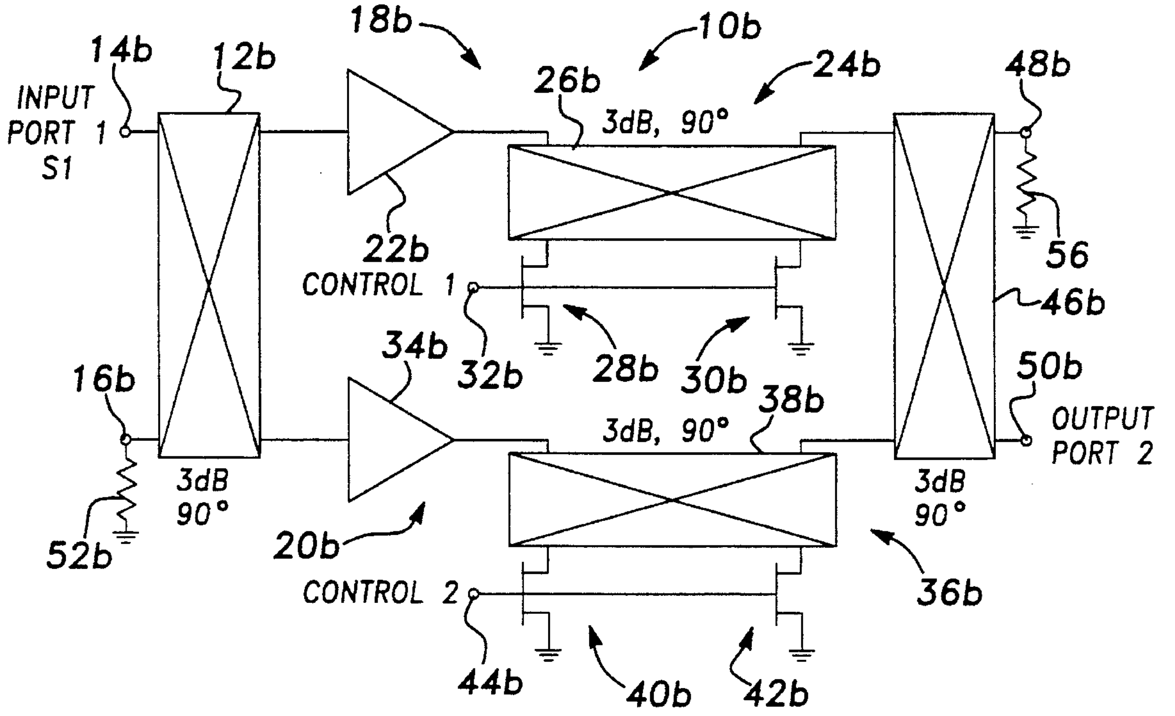
FIG. 3 is a schematic block diagram of a phase shifter and low-noise switch according to another embodiment of the present invention.

FIG. 3 shows a schematic block diagram of a phase shifter and low-noise switch 10*b* according to another embodiment of the present invention that significantly parallels the structure of the switch 10 above. Like components of the switch 10*b* to that of the switches 10 and 10*a* are labeled the same followed by the reference numeral "b". In this embodiment, the output port 48*b* includes an output load represented by a load resistor 56 such that only output signals are taken at the output port 50*b*. A state table, Table 3 below, shows the value of the input port 14*a* and the output port 50*b* for different control biases at the ports 32*b* and 44*b*. When either of the gate terminal ports 32*b* or 44*b* are biased, and the other port 32*b* or 44*b* is unbiased, the switch 10*b* acts like a balanced LNA, and the signals from the two paths 18*b* and 20*b* at the output port 50*b* are out of phase and cancelled. Therefore, the switch 10*b* is off at these states. On the other hand, when the ports 32*b* and 44*b* are both biased or unbiased, the signals from the two paths 18*b* and 20*b* are in phase, and the switch 10*b* is on. If both the gate terminal ports 32*b* and 44*b* are biased, then the output signal at the port 50*b* is the gain G times the signal S1 at the phase angle θ. If the gate terminal ports 32*b* and 44*b* are both unbiased, then the output signal at the output port 50*b* is the gain G times the input signal S1 at the phase angle θ+180°. Note that the two biased states of the switch 10*b* are 180° out of phase with each other. The switch 10*b* is the same as the switch 10*a* above except that output signals are taken at the port 50*b* instead of the output port 48*b*.

TABLE 3

| CONTROL | | INPUT | OUTPUT |
|---|---|---|---|
| Control 1 | Control 2 | Port 1 | Port 2 |
| Short | Short | S1 | G.S1∠θ |
| Open | Open | S1 | G.S1∠θ + 180° |
| Short | Open | S1 | 0 |
| Open | Short | S1 | 0 |

Figure 4:
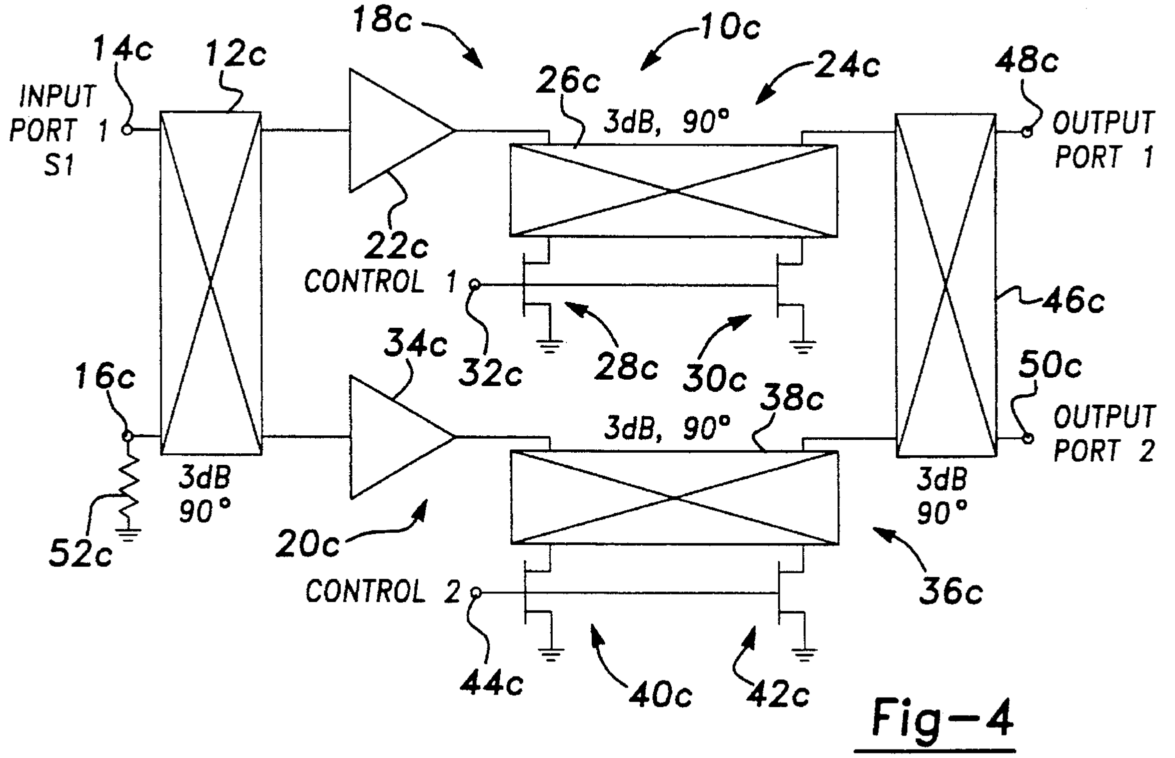
FIG. 4 is a schematic block diagram of a phase shifter and low-noise switch according to another embodiment of the present invention.

FIG. 4 shows a schematic block diagram of a phase shifter and low-noise switch 10*c* that can act as a single pole double throw (SPDT) switch according to another embodiment of the present invention. The switch 10*c* significantly parallels the structure of the switch 10 above. Like components of the switch 10*c* to that of the switches 10, 10*a* and 10*b* above are labeled the same followed by the reference numeral "c". In this embodiment, the input port 14*c* includes an input load represented by a load resistor 52*c*. This embodiment is a combination of the switches 10*a* and 10*b* as indicated by state Table 4 below. The switch 10*c* acts as an SPDT switch in that the input signal at the port 14*c* can be transferred to either the output port 48*c* or 50*c* depending on the controls bias signals on the control ports 32*c* and 44*c*. The output port 48*c* or 50*c* that does not get the input signal S1, is impedance matched to the output circuitry (not shown) by the load resistor 52*c*.

TABLE 4

| CONTROL | | INPUT | OUTPUT | |
|---|---|---|---|---|
| Control 1 | Control 2 | Port 1 | Port 1 | Port 2 |
| Short | Short | S1 | 0 | G.S1∠θ |
| Open | Open | S1 | 0 | G.S1∠θ + 180° |
| Short | Open | S1 | G.S1∠ϕ | 0 |
| Open | Short | S1 | G.S1∠ϕ + 180° | 0 |

Figure 5:
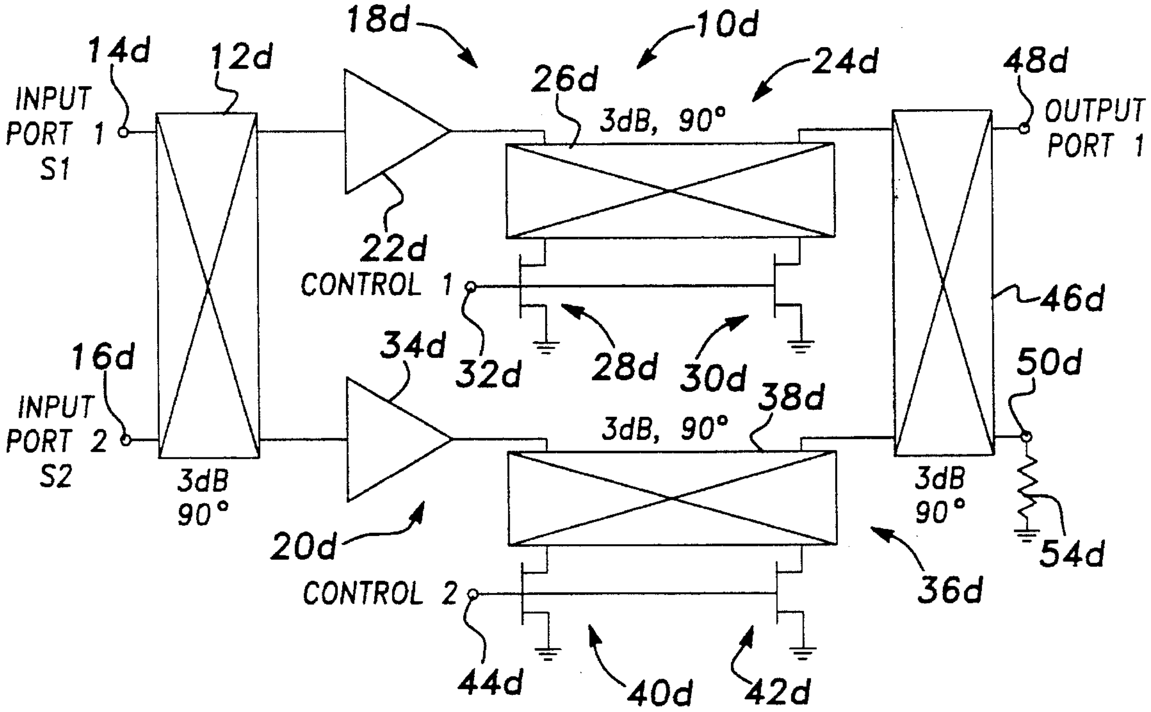
FIG. 5 is a schematic block diagram of a phase shifter and low-noise switch according to another embodiment of the present invention.

FIG. 5 shows a schematic block diagram of a phase shifter and low-noise switch 10*d* of another SPDT switch according to another embodiment of the present invention that significantly parallels the structure of the switch 10 above. Like components of the switch 10*d* to that of 10, 10*a*, 10*b* and 10*c* are labeled the same followed by the reference numeral "d". In this embodiment, the output port 50*d* includes a load resistor 54*d*. State Table 5 below gives the output states at the output port 48*d* with respect to the input signals S1 and S2 at the input ports 14*d* and 16*d*, respectively. Particularly, if the gate terminal ports 32*d* and 44*d* are both biased, then the output signal at the output port 48*d* is the gain G times the input signal S2 at the phase angle θ. If the gate terminal ports 32*d* and 44*d* are both unbiased, then the output signal at the output port 48*d* is the gain G times the input signal S2 at the phase angle θ+180°. If the port 32*d* is biased and the port 44*d* is unbiased, then the signal at the output port 48*d* is the gain G times the input signal S1 at the phase angle ϕ. If the port 32*d* is unbiased and the port 44*d* is biased, then the output signal at the port 44*d* is the gain G times the input signal S1 at the phase angle ϕ+180°. In this embodiment, the input signals S1 and S2 can be selectively applied to the output port 48*d* depending on the bias of the control ports 32*d* and 44*d*.

TABLE 5

| CONTROL | | INPUT | | OUTPUT |
|---|---|---|---|---|
| Control 1 | Control 2 | Port 1 | Port 2 | Port 1 |
| Short | Short | S1 | S2 | G.S2∠θ |
| Open | Open | S1 | S2 | G.S2∠θ + 180° |
| Short | Open | S1 | S2 | G.S1∠ϕ |
| Open | Short | S1 | S2 | G.S1∠ϕ + 180° |

The switch 10*a*, as represented in FIG. 2, has application as a BSLNA at an input stage of a thermal imager well known to those skilled in the art. Thermal imagers generally act passively in that they sense radiation at particular wavelengths, such as infrared, without the imager emitting an excitation signal that is reflected off of objects in the scene. These types of systems incorporate antenna arrays having many antenna elements where each element is a pixel of the image. Each antenna element receives thermal radiation from the scene, which is selectively output to an imaging device typically on a pixel-by-pixel basis. Because this type of thermal imager acts passively, the radiation signal received by the antenna elements is fairly small relative to electronic noise in the system. Therefore, the BSLNA 10*a* becomes useful in these types of devices where noise in the system is continuously applied to the output port 48*a* when the gate ports 32*a* and 44*a* are unbiased, and then noise of the system and the RF signal S1 at the input port 14*a* are applied to the output port 48*a* when the control gate port 32*a* is biased. In this manner, the subsequent processing circuitry can separate the noise of the system and provide a relatively more stable amplified RF signal S1.

Figure 6:
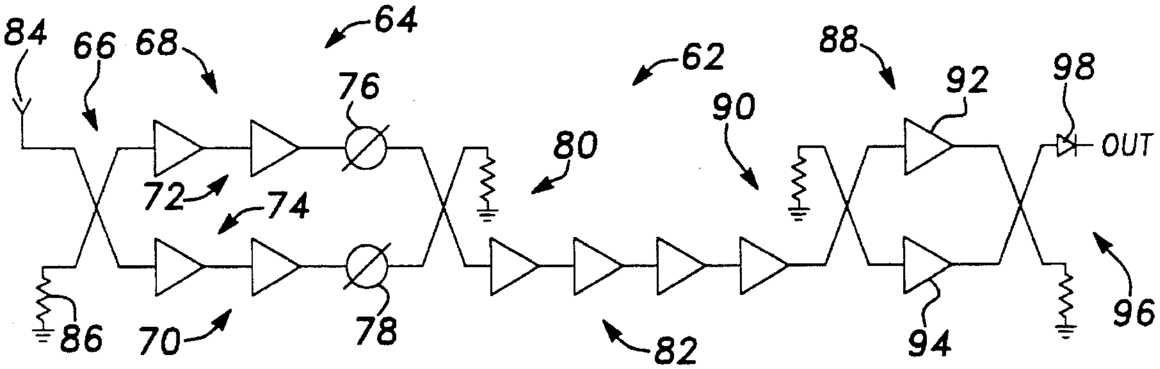
FIG. 6 is a schematic block diagram of a balanced switching low-noise amplifier and detector according to an embodiment of the present invention.

FIG. 6 is a schematic block diagram of a balanced radiometer 62 (thermal imager) incorporating a BSLNA 64 of the same type as the switch 10*a* of FIG. 3 above. In this embodiment, the BSLNA 64 includes a hybrid coupler 66 that separates the BSLNA 64 into a first path 68 and a second path 70. The first path 68 includes two amplifiers 72 intended to represent the amplifier 22*a*, and the second path 70 includes two amplifiers 74 intended to represent the amplifier 34*a*. Further, the first path 68 includes a phase shifter 76 intended to represent the phase shifter 24, and the second path 70 includes phase shifter 78 intended to represent the phase shifter 36*a*. A hybrid coupler 80 couples an output from the first path 68 and the second path 70 into a series of buffer amplifiers 82. The output of the BSLNA 64 can be selectively switched between an input signal from an antenna 84 or an impedance matched noise signal from an input load resistor 86.

The amplified signal from the buffer amplifiers 82 is applied to an amplifier 88 including a coupler 90. The coupler 90 separates the signal into a first amplifier path including an amplifier 92 and a second amplifier path including an amplifier 94. The outputs from the amplifiers 92 and 94 are applied to another coupler 96 that couples the signal into a diode detector 98. The diode detector 98 converts the RF signals to comparable DC level signals for subsequent signal processing.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A low noise electronic control device comprising:

an input coupler, said input coupler including a first input port and a second input port connected to the input coupler, said input coupler coupling signals at the first and second input ports into a first path and a second path of the device;

a first low noise amplifier associated with the first path, said first amplifier being responsive to signals applied to the first path from the input coupler to provide an amplified first path signal;

a first phase shifter associated with the first path, said first phase shifter being responsive to the amplified first path signal from the first low noise amplifier, said first phase shifter including a first path coupler and a first path coupler control circuit, said first path coupler control circuit being responsive to a first control signal that controls the operation of the first path coupler;

a second low noise amplifier associated with the second path, said second amplifier being responsive to signals applied to the second path from the input coupler to provide an amplified second path signal; and a second phase shifter associated with the second path, said second phase shifter being responsive to the amplified second path signal from the second low noise amplifier, said second phase shifter including a second path coupler and a second path coupler control circuit, said second path coupler control circuit being responsive to a second control signal that controls the operation of the second path coupler.

2. The device according to claim 1 further comprising an output coupler, said output coupler including a first output port and a second output port, said output coupler coupling an output signal from the first path and an output signal from the second path into the first and second output ports.

3. The device according to claim 2 wherein the input coupler is responsive to a first input signal applied to the first input port and a second input signal applied to the second input port, and wherein the input coupler applies the first input signal to the first path at a first phase and the first input signal to the second path at a second phase, and applies the second input signal to the first path at the first phase and the second input signal to the second path at the second phase.

4. The device according to claim 3 wherein the first and second phases are 90° apart in phase.

5. The control device according to claim 2 wherein the first path coupler control circuit includes first and second switching devices and the second path coupler control circuit includes first and second switching devices, said first and second switching devices of the first path being simultaneously switched on and off by the first control signal and the first and second switching devices of the second path being simultaneously switched on and off by the second control signal.

6. The device according to claim 5 wherein the input coupler is responsive to a first input signal applied to the first input port and a second input signal applied to the second input port, and wherein when the first control signal switches the first and second switching devices of the first path on and the second control signal switches the first and second switching devices of the second path on, the second input signal will be applied to the first output port at a first phase angle and the first input signal will be applied to the second output port at the first phase angle, and wherein when the first control signal switches the first and second switching devices of the first path off and the second control signal switches the first and second switching devices of the second path off, the second input signal will be applied to the first output port at the first phase angle plus 180° and the first input signal will be applied to the second output port at the first phase angle plus 180°, and wherein when the first control signal switches the first and second switching devices of the first path on and the second control signal switches the first and second switching devices of the second path off, the first input signal will be applied to the first output port at a second phase angle and the second input signal will be applied to the second output port at the second phase angle, and wherein when the first control signal switches the first and second switching devices of the first path off and the second control signal switches the first and second switching devices of the second path on, the first input signal will be applied to the first output port at the second phase angle plus 180° and the second input signal will be applied to the second output port at the second phase angle plus 180°.

7. The device according to claim 5 wherein the first input port is responsive to an input signal, the second input port is connected to an input load resistor and the second output port is connected to an output load resistor, and wherein when the first control signal switches the first and second switching devices of the first path on and the second control signal switches the first and second switching devices of the second path on, and when the first control signal switches the first and second switching devices of the first path off and the second control signal switches the first and second switching devices of the second path off, the output signal at the first output port is out of phase and cancelled, and wherein when the first control signal switches the first and second switching devices of the first path on and the second control signal switches the first and second switching devices of the second path off, the input signal will be applied to the first output port at a particular phase angle, and wherein when the first control signal switches the first and second switching devices of the first path off and the second control signal switches the first and second switching devices of the second path on, the input signal is applied to the first output port at the phase angle plus 180°.

8. The device according to claim 5 wherein the second input port is connected to an input load resistor, the first output port is connected to an output load resistor and the first input port is responsive to an input signal, and wherein when the first control signal switches the first and second switching devices of the first path on and the second control signal switches the first and second switching devices of the second path off, and when the first control signal switches the first and second switching devices of the first path off and the second control signal switches the first and second switching devices of the second path on, the output signal at the second output port is out of phase and cancelled, and wherein when the first control signal switches the first and second switching devices of the first path on and the second control signal switches the first and second switching devices of the second path on, the input signal will be applied to the second output at a particular phase angle, and wherein when the first control signal switches the first and second switching devices of the first path off and the second control signal switches the first and second switching devices of the second path off, the input signal will be applied to the second output port at the phase angle plus 180°.

9. The device according to claim 5 wherein the first input port is responsive to an input signal and the second input port is connected to an input load resistor, and wherein when the first control signal switches the first and second switching devices of the first path on and the second control signal switches the first and second switching devices of the second path on, the input signal is applied to the second output port at a first phase angle, and wherein when the first control signal switches the first and second switching devices of the first path off and the second control signal switches the first and second switching devices of the second path off, the input signal is applied to the second output port at the first phase angle plus 180°, and wherein when the first control signal switches the first and second switching devices of the first path on and the second control signal switches the first and second switching devices of the second path off, the input signal is applied to the first output port at a second phase angle, and wherein when the first control signal switches the first and second switching devices of the first path off and the second control signal switches the first and second switching devices of the second path on, the input signal is applied to the first output port at the second phase angle plus 180°.

10. The device according to claim 5 wherein the first input port is responsive to a first input signal, the second input port is responsive to a second input signal, and the second output port is connected to an output load resistor, and wherein when the first control signal switches the first and second switching devices of the first path on and the second control signal switches the first and second switching devices of the second path on, the second input signal is applied to the first output port at a first phase angle, and wherein when the first control signal switches the first and second switching devices of the first path off and the second control signal switches the first and second switching devices of the second path off, the second input signal is applied to the first output port at the first phase angle plus 180°, and wherein when the first control signal switches the first and second switching devices of the first path on and the second control signal switches the first and second switching devices of the second path off, the first input signal is applied to the first output port at a second phase angle, and wherein when the first control signal switches the first and second switching devices of the first path off and the second control signal switches the first and second switching devices of the second path on, the first input signal is applied to the first output port at the second phase angle plus 180°.

11. The device according to claim 5 wherein the first and second switches of the first phase shifter and the first and second switches of the second phase shifter are field effect controlled devices.

12. The device according to claim 1 wherein the input coupler, the first path coupler and the second path coupler are 3 dB 90° hybrid couplers.

13. The device according to claim 1 wherein the second input port is connected to an input load.

14. A low noise electronic control device comprising:

an input coupler, said input coupler including a first input port and a second input port connected to the input coupler, said input coupler coupling signals at the first and second input ports into a first path and a second path of the device;

a first low noise amplifier associated with the first path, said first amplifier responsive to signals applied to the first path from the input coupler to provide an amplified first path signal;

a first phase shifter associated with the first path, said first phase shifter being responsive to the amplified first path signal from the first low noise amplifier, said first phase shifter including a first path coupler and first and second switching devices, said switching devices being simultaneously switched between an on state and an off state by, a first control signal to control the operation of the first phase shifter;

a second amplifier associated with the second path, said second amplifier being responsive to signals applied to the second path from the input coupler to provide an amplified second path signal;

a second phase shifter associated with the second path, said second phase shifter being responsive to the amplified second path signal from the second low noise amplifier, said second phase shifter including a second path coupler and first and second switching devices, said switching devices of the second phase shifter being simultaneously switched between an on state and an off state by a second control signal to control the operation of the second phase shifter; and an output coupler, said output coupler including a first output port and a second output port connected to the output coupler, said output coupler coupling an output signal from the first path and an output signal from the second path into the first and second output ports.

15. The device according to claim 14 wherein the input coupler is responsive to a first input signal applied to the first input port and a second input signal applied to second input port, and wherein the input coupler applies the first input signal to the first path at a first phase and the first input signal to the second path at a second phase, and applies the second input signal to the first path at the first phase and the second input signal to the second path at the second phase.

16. The device according to claim 15 wherein the first and second phases are 90° apart in phase.

17. The device according to claim 14 wherein the input coupler, the first path coupler, the second path coupler and the output coupler are 3 dB 90° hybrid couplers.

18. The device according to claim 14 wherein the first and second switching devices of the first phase shifter and the first and second switching devices of the second phase shifter are field effect controlled devices.

19. A low noise electronic control device comprising:

an input coupler, said input coupler including at least a first input port, said input coupler coupling input signals at the at least first input port into an input path;

a low noise amplifier in the input path, said low noise amplifier being responsive to the input signal applied to the input path and generating an amplified low noise input signal; and a phase shifter in the input path, said phase shifter including a coupler and first and second switching devices, said coupler being responsive to the amplified input signal, said first and second switching devices being selectively switched on and off by a common control signal to shift the amplified input signal in phase.

20. The control device according to claim 19 wherein the first and second switching devices are field effect controlled switches.

* * * * *